(12) United States Patent
Kitahara et al.

(10) Patent No.: US 7,696,014 B2
(45) Date of Patent: Apr. 13, 2010

(54) METHOD FOR BREAKING ADHESIVE FILM MOUNTED ON BACK OF WAFER

(75) Inventors: Nobuyasu Kitahara, Tokyo (JP); Yuki Ogawa, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/390,024

(22) Filed: Feb. 20, 2009

(65) Prior Publication Data

US 2009/0215246 A1 Aug. 27, 2009

(30) Foreign Application Priority Data

Feb. 21, 2008 (JP) .............................. 2008-039732

(51) Int. Cl.
*H01L 21/00* (2006.01)
(52) U.S. Cl. ...................... 438/118; 438/462; 438/463; 257/E23.034; 257/E21.517
(58) Field of Classification Search ................. 438/118, 438/462, 463, 464; 257/E23.034, E21.517
See application file for complete search history.

(56) References Cited

U.S. PATENT DOCUMENTS

| 5,923,995 | A | * | 7/1999 | Kao et al. ................... 438/460 |
| 6,638,865 | B2 | | 10/2003 | Tanaka |
| 7,129,150 | B2 | | 10/2006 | Kawai |
| 7,157,353 | B2 | * | 1/2007 | Farnworth et al. .......... 438/462 |
| 2008/0190902 | A1 | | 8/2008 | Nakamura |

FOREIGN PATENT DOCUMENTS

| JP | 2000-182995 | 6/2000 |
| JP | 2002-118081 | 4/2002 |
| JP | 3408805 | 3/2003 |
| JP | 2004-273895 | 9/2004 |
| JP | 2008-227470 | 9/2008 |

OTHER PUBLICATIONS

English Language Abstract of JP 2000-182995.
English Language Abstract JP 3408805.

* cited by examiner

*Primary Examiner*—Julio J Maldonado
(74) *Attorney, Agent, or Firm*—Greenblum & Bernstein P.L.C.

(57) ABSTRACT

A method for breaking an adhesive film mounted on the back of a wafer having a plurality of streets formed in a lattice pattern on the face of the wafer, and having devices formed in a plurality of regions demarcated by the plurality of streets, the devices being divided individually, is adapted to break the adhesive film along the outer peripheral edges of the individual devices, with the adhesive film being stuck to the surface of a dicing tape mounted on an annular frame. The method comprises: a laser processing step of projecting a laser beam with a pulse width of 100 picoseconds or less onto the adhesive film through gaps between the individually divided devices to form deteriorated layers in the adhesive film along the outer peripheral edges of the individual devices; and an adhesive film breaking step of exerting external force on the adhesive film having the deteriorated layers formed therein, to break the adhesive film along the deteriorated layers.

5 Claims, 10 Drawing Sheets (a)

| PULSE WIDTH / AVERAGE OUTPUT | 200 (ns) | 100 (ns) | 10 (ns) | 100 (ps) | 50 (ps) | 10 (ps) |
|---|---|---|---|---|---|---|
| 1W | × | × | × | ○ | ○ | ○ |
| 2W | × | × | × | △ | ○ | ○ |
| 3W | × | × | × | △ | ○ | ○ |

METHOD FOR BREAKING ADHESIVE FILM MOUNTED ON BACK OF WAFER

FIELD OF THE INVENTION

This invention relates to a method for breaking an adhesive film for die bonding, which has been mounted on the back of a wafer having a plurality of devices formed therein, along the outer peripheral edges of the individual devices.

DESCRIPTION OF THE PRIOR ART

In a semiconductor device manufacturing process, a plurality of regions are demarcated by division-scheduled lines, called streets, which are formed in a lattice pattern on the face of a nearly disk-shaped semiconductor wafer. Devices, such as IC's or LSI's, are formed in these demarcated regions. The semiconductor wafer is cut along the streets, whereby the regions having the devices formed therein are divided to produce the individual devices. An optical device wafer having a gallium nitride-based compound semiconductor or the like laminated on the surface of a sapphire substrate is also cut along predetermined streets, and divided thereby into individual optical devices such as light emitting diodes and laser diodes. These devices are widely used for electrical equipment.

The individually divided devices each have an adhesive film for die bonding mounted on the back of the device, the adhesive film being formed from an epoxy resin or the like, having a thickness of 20 to 40 μm, and called a die attach film. The device is bonded via the adhesive film to a die bonding frame, which supports the device, by thermocompression bonding. A method for mounting the die bonding adhesive film to the back of the device is disclosed in JP-A-2000-182995, and is in common use. This method comprises sticking the adhesive film to the back of a semiconductor wafer, sticking the semiconductor wafer to a dicing tape via the adhesive film, and then severing the semiconductor wafer, together with the adhesive film, by a cutting blade along the streets formed on the face of the semiconductor wafer to form the devices having the adhesive film mounted on the back thereof.

In recent years, a lighter weight and a smaller size have been demanded of electrical equipment, including cellular phones and personal computers, and thinner devices have been desired. A dividing technique, called the DBG (dicing before grinding) method, has been put to practical use as a technique for dividing the semiconductor wafer into thinner devices. The DBG method is a technology in which division grooves of a predetermined depth (a depth corresponding to the finished thickness of the device) are formed along the streets in the face of the semiconductor wafer, whereafter the back of the semiconductor wafer having the division grooves formed in the face thereof is ground to expose the division grooves at the back, thereby dividing the semiconductor wafer into the individual devices. According to this technology, the thickness of the device can be machined to 100 μm or less.

The DBG method, however, poses the following problem: In dividing the semiconductor wafer into the individual devices by this method, the division grooves of the predetermined depth are formed in the face of the semiconductor wafer along the streets, whereafter the back of the semiconductor wafer is ground to expose the division grooves at the back, as mentioned above. Thus, the adhesive film for die bonding cannot be mounted, beforehand, on the back of the semiconductor wafer. Hence, when the device produced by the DBG method is bonded to the die bonding frame, this bonding has to be performed, with a bonding agent being inserted between the device and the die bonding frame, so that a bonding operation cannot be carried out smoothly.

To solve such a problem, JP-A-2002-118081 proposes a method for producing a semiconductor device, in which an adhesive film for die bonding is mounted on the back of a semiconductor wafer divided into individual devices by the DBG method, the semiconductor wafer is stuck to a dicing tape via the adhesive film, and then portions of the adhesive film exposed at the gaps between the devices are irradiated with a laser beam from the face side of the devices through the gaps to melt-cut the adhesive film along the outer peripheral edges of the individual devices.

In recent years, as a method for dividing a plate-shaped workpiece, such as a semiconductor wafer, there has been a laser processing method which uses a pulsed laser beam of a wavelength capable of passing through or permeating the workpiece, and irradiating the workpiece with the pulsed laser beam while aligning the focused spot of the pulsed laser beam with the interior of the region to be divided. This laser processing method is disclosed in Japanese Patent No. 3,408,805. A dividing method relying on this laser processing method comprises irradiating the workpiece with the pulsed laser beam, which has permeating properties for the workpiece, along the street from one surface of the workpiece, while aligning the focused spot of the pulsed laser beam with the interior of the workpiece, thereby continuously forming deteriorated layers in the interior of the workpiece along the streets, and applying an external force along the streets whose strength has been decreased by the formation of the deteriorated layers, thereby dividing the workpiece.

Moreover, JP-A-2004-273895 proposes a method in which an adhesive film for die bonding is mounted on the back of the wafer having the deteriorated layers formed along the streets by use of the above-mentioned laser processing method, the wafer is stuck to a dicing tape via the adhesive film, and then the dicing tape is enlarged to divide the wafer into the individual devices along the streets whose strength has been decreased by the formation of the deteriorated layers, and to break the adhesive film along the outer peripheral edges of the divided devices.

However, the above method, which divides the wafer and breaks the adhesive film stuck to the wafer along the streets by the enlargement of the dicing tape having the wafer stuck thereto, poses the following problem: Upon enlargement of the dicing tape, the wafer decreased in strength because of the formation of the deteriorated layers is divided into the individual devices along the streets, while the adhesive film is tenacious and, when subjected to tension, is elongated and is difficult to break without fail.

To solve such problems, the applicant of the present application proposed the following method as JP-A-2008-227470: The wafer decreased in strength because of the formation of the deteriorated layers is divided into the individual devices along the division-scheduled lines by the enlargement of the dicing tape. Then, with the dicing tape being enlarged, a laser beam of a wavelength absorbable to the adhesive film is projected onto the adhesive film through the gaps of the divided individual devices, whereby breakage grooves are formed in the adhesive film along the outer peripheral edges of the individual devices.

However, when the laser beam is projected onto the adhesive film through the gaps of the divided individual devices, debris scatters and the scattered debris deposits on the surface of the device to affect the quality of the device.

SUMMARY OF THE INVENTION

It is an object of the present invention to provide a method for breaking an adhesive film mounted on the back of a wafer, the method being capable of projecting a laser beam onto the adhesive film through gaps between devices, without scattering debris, thereby breaking the adhesive film along the outer peripheral edges of the devices.

According to the present invention, intended for attaining the above object, there is provided a method for breaking an adhesive film mounted on the back of a wafer having a plurality of streets formed in a lattice pattern on the face of the wafer, and having devices formed in a plurality of regions demarcated by the plurality of streets, the devices being divided individually, the method being adapted to break the adhesive film along outer peripheral edges of the individual devices, with the adhesive film being stuck to a surface of a dicing tape mounted on an annular frame, the method comprising:

a laser processing step of projecting a laser beam with a pulse width of 100 picoseconds or less onto the adhesive film through gaps between the individually divided devices to form deteriorated layers in the adhesive film along the outer peripheral edges of the individual devices; and an adhesive film breaking step of exerting external force on the adhesive film having the deteriorated layers formed therein, to break the adhesive film along the deteriorated layers.

The pulse width of the laser beam projected onto the adhesive film in the laser processing step is desirably set at 50 picoseconds or less.

Preferably, the average output of the laser beam projected onto the adhesive film in the laser processing step is set at 1 to 3 W.

The laser processing step is desired to be performed, with the dicing tape being enlarged to widen the gaps between the individual devices.

The adhesive film breaking step enlarges the dicing tape to apply tension to the adhesive film.

According to the method for breaking an adhesive film mounted on the back of a wafer, the laser beam projected onto the adhesive film in the laser processing step has a pulse width of 100 picoseconds or less. Since this method can form the deteriorated layers in the adhesive film, without scattering of debris, there is no deposition of debris on the surface of the device. The adhesive film having the deteriorated layers formed along the outer peripheral edges of the individual devices can be easily broken along the deteriorated layers upon application of external force.

BRIEF DESCRIPTION OF THE DRAWINGS

FIG. 10 is a view showing the results of experiments on the pulse width of a pulsed laser beam projected onto the adhesive film in the deteriorated layer forming step and the degree to which debris occurs.

DETAILED DESCRIPTION OF THE PREFERRED EMBODIMENTS

Figure 1:
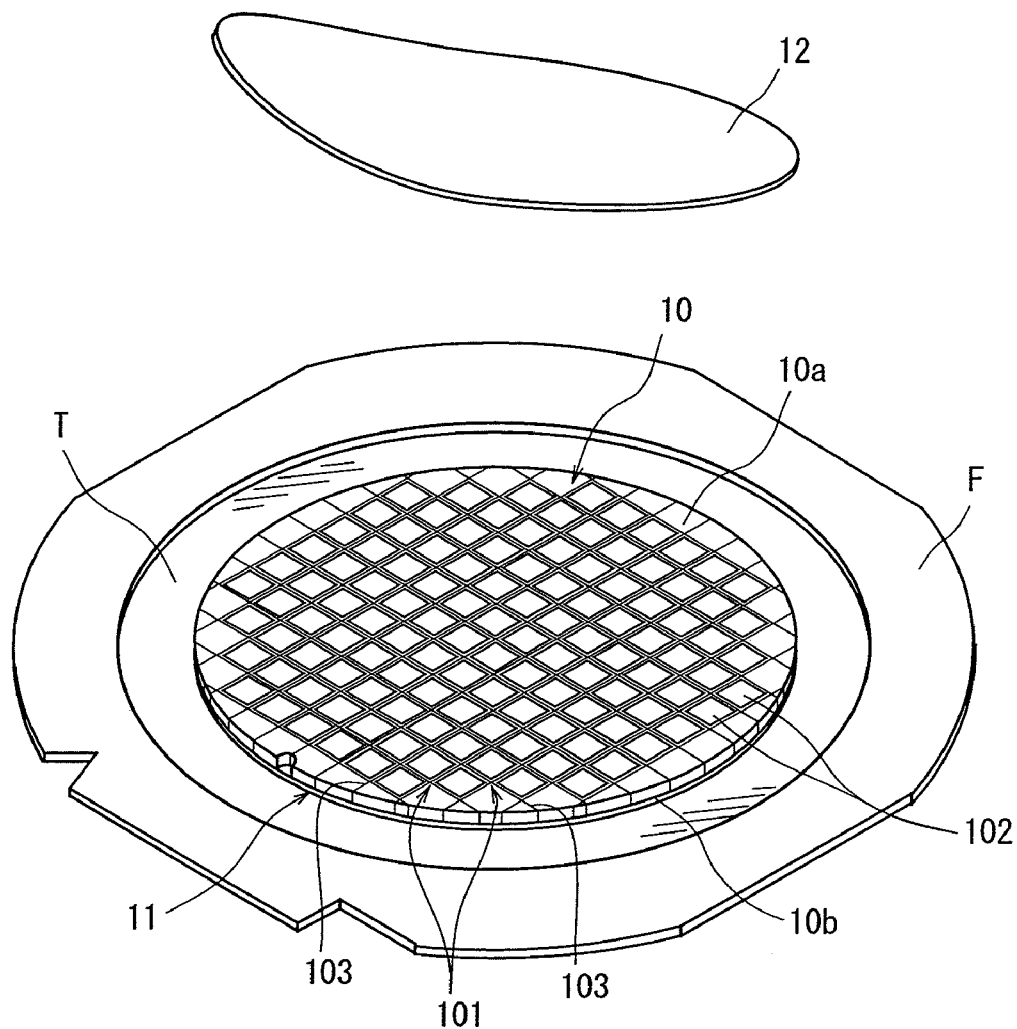
FIGS. 1(a) and 1(b) are a perspective view and a partial sectional view, respectively, of a first embodiment showing a state where a semiconductor wafer having an adhesive film for die bonding mounted on the back thereof is stuck to a dicing tape mounted on an annular frame.
Figure 1:
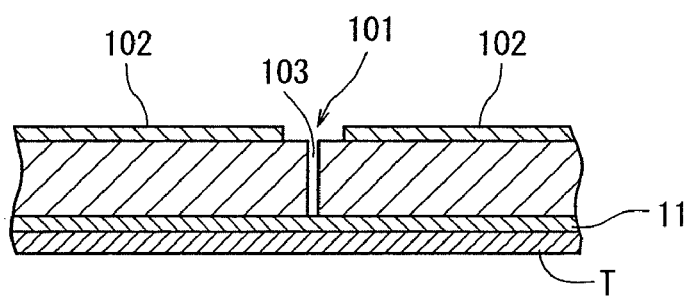

Preferred embodiments of the method for breaking the adhesive film mounted on the back of the wafer in accordance with the present invention will be described in detail by reference to the accompanying drawings.

The form of the wafer having the adhesive film mounted on the back thereof will be described first.

FIGS. 1(a) and 1(b) show a state where an adhesive film 11 for die bonding is mounted on the back of a semiconductor wafer 10 divided into individual devices by the so-called DBG method, the adhesive film 11 is stuck to the surface of a dicing tape T mounted on an annular frame F, and a protective tape 12 stuck to the face of the semiconductor wafer 10 has been peeled off. In the semiconductor wafer 10 shown in FIGS. 1(a) and 1(b), a plurality of streets 101 are formed in a lattice pattern on the face 10a of the semiconductor wafer 10, and devices 102 are formed in a plurality of regions demarcated by the plurality of streets 101. To divide the semiconductor wafer 10 into the individual devices by the DBG method, division grooves 103 of a predetermined depth (depth corresponding to the finished thickness of the device) are formed along the streets 101 formed on the face 10a of the semiconductor wafer 10 by use of a cutting apparatus (division groove forming step). Then, the protective tape 12 is stuck to the face of the semiconductor wafer 10 where the division grooves 103 have been formed, and the back of the semiconductor wafer 10 is ground to expose the division grooves at the back, whereby the semiconductor wafer 10 is divided into the individual devices 102 (division groove exposing step). The adhesive film 11 for die bonding is mounted on the back 10b of the semiconductor wafer 10 thus divided into the individual devices 102, and the side of the semiconductor wafer 10 having the adhesive film 11 is stuck to the surface of the dicing tape T mounted on the annular frame F. Then, the protective tape 12 stuck to the face of the semiconductor wafer 10 is peeled off, as shown in FIG. 1(a).

The adhesive film 11 comprises an epoxy resin film with a thickness of 20 to 40 μm, and is mounted on the back 10b of the semiconductor wafer 10 by being pressed against the back 10b while being heated at a temperature of 80 to 200° C. An adhesive film pre-pasted dicing tape having the adhesive film stuck to the surface of a dicing tape can be used as the dicing tape T. In this case, the back of the semiconductor wafer 10 divided into the individual devices by the DBG method as described above is placed on the adhesive film of the adhesive film-coated dicing tape mounted on the annular frame. Then, the adhesive film 11, while being heated at a temperature of 80 to 200° C., is pressed against the back 10b of the semiconductor wafer 10 until it is mounted on the back 10b. The above annular frame F is, for example, a 1 mm thick stainless steel frame of an annular shape. The above dicing tape T is, in the illustrated embodiment, a 70 μm thick sheet substrate comprising polyvinyl chloride (PVC), the surface of the sheet substrate being coated with a pressure sensitive adhesive glue to a thickness of the order of 5 μm.

FIGS. 2(a) and 2(b) show a state where the adhesive film 11 for die bonding is mounted on the back of the semiconductor wafer 10 having deteriorated layers 104 formed in the interior of the semiconductor wafer 10 along the streets 101, and the side of the semiconductor wafer 10 having the adhesive film 11 is stuck to the surface of the dicing tape T mounted on the annular frame F. To form the deteriorated layers 104 in the interior of the semiconductor wafer 10 along the streets 101, a pulsed laser beam of a wavelength (e.g., 1064 nm) having permeating properties for the wafer is projected onto the wafer from the back 10b of the semiconductor wafer 10 along the streets 101, with the focused spot of the pulsed laser beam being aligned with the interior of the semiconductor wafer 10, thereby continuously forming the deteriorated layers 104 in the interior of the semiconductor wafer 10 along the streets 101 (deteriorated layer forming step). In this manner, the adhesive film 11 for die bonding is mounted on the back 10b of the semiconductor wafer 10 having the deteriorated layers 104 formed in the interior of the semiconductor wafer 10 along the streets 101, and the side of the semiconductor wafer 10 mounted with the adhesive film 11 is stuck to the surface of the dicing tape T mounted on the annular frame F.

Next, an explanation will be offered for the method of breaking the adhesive film stuck to the back of the wafer, which breaks the above-mentioned adhesive film 11 for die bonding, mounted on the back 10b of the semiconductor wafer 10, along the outer peripheral edges of the individual devices 102, with the adhesive film 11 being stuck to the surface of the dicing tape T mounted on the annular frame F.

Figure 3:
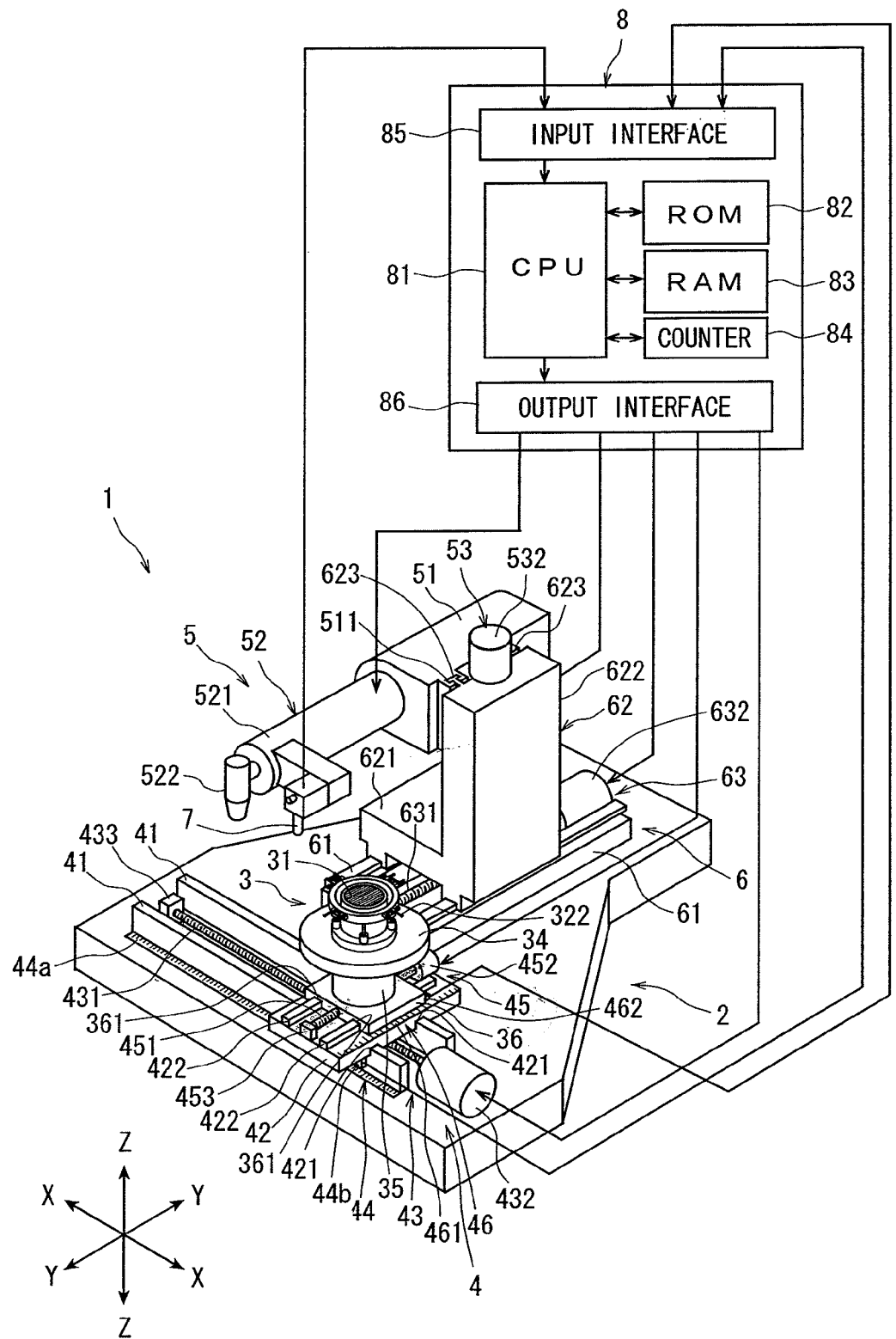
FIG. 3 is a perspective view of a laser processing apparatus for performing a method for breaking an adhesive film mounted on the back of a wafer according to the present invention.

FIG. 3 shows a perspective view of a laser processing apparatus for performing the method for breaking the adhesive film mounted on the back of the wafer according to the present invention. A laser processing apparatus 1 shown in FIG. 3 comprises a stationary platform 2; a tape enlarging mechanism 3 which is disposed on the stationary platform 2 to be movable in a processing feed direction indicated by a double-headed arrow X, holds the wafer stuck to the surface of a dicing tape mounted on an annular frame (to be described later), and enlarges the dicing tape; a processing feed mechanism 4 for supporting the tape enlarging mechanism 3 to be movable in the processing feed direction indicated by the double-headed arrow X; a laser beam projection unit 5 equipped with a laser beam projection means for irradiating the wafer held by the tape enlarging mechanism 3 with a laser beam; and a laser beam projection unit support mechanism 6 for supporting the laser beam projection unit 5.

Figure 4:
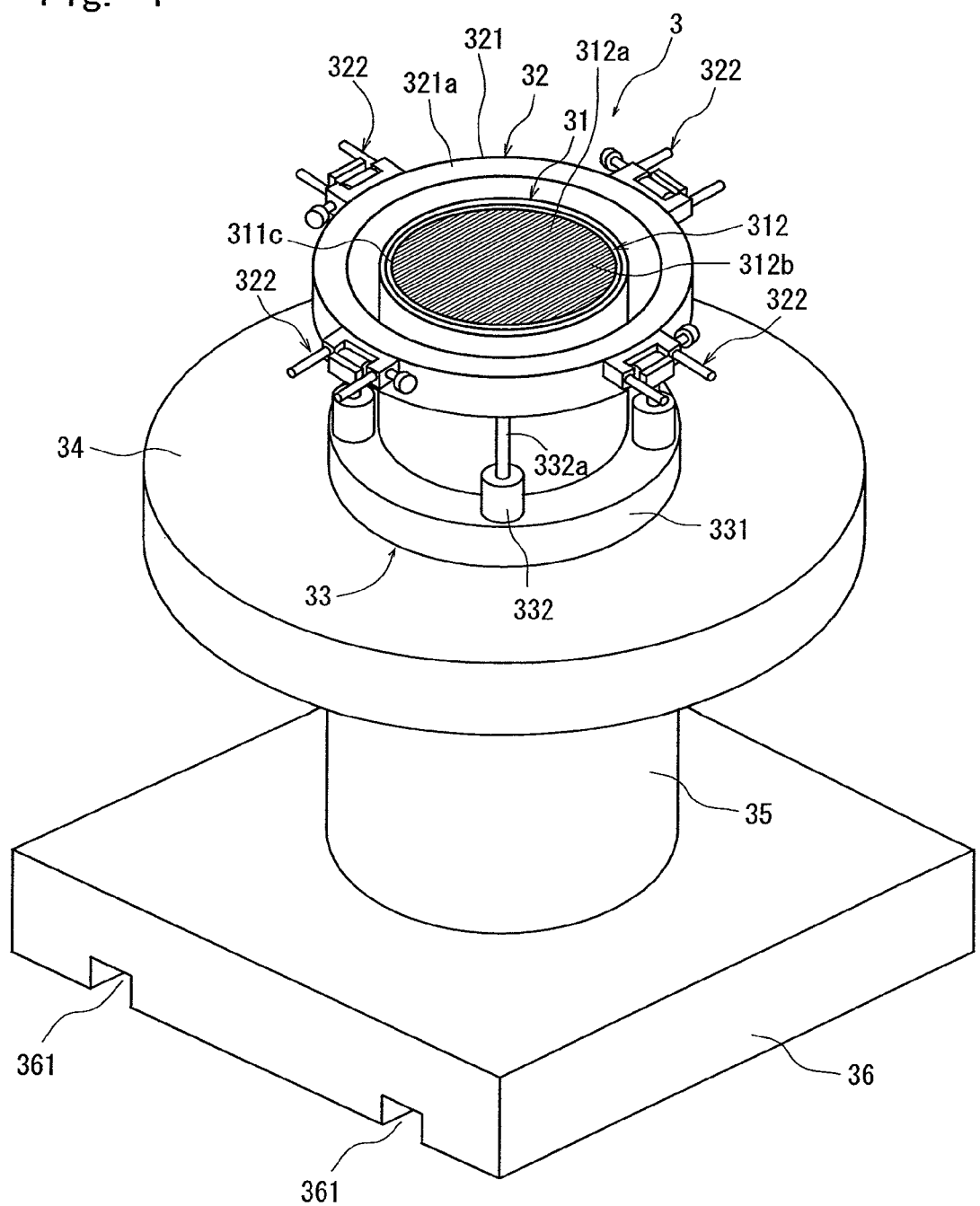
FIG. 4 is a perspective view of a tape enlarging mechanism installed in the laser processing apparatus shown in FIG. 3.

The tape enlarging mechanism 3, as shown in FIG. 4, comprises a chuck table 31 for holding a wafer sticking region in the dicing tape T mounted on the annular frame F; a frame holding means 32 for holding the annular frame F; a moving means 33 for moving the frame holding means 32 and the chuck table 31 relative to each other in the axial direction; a support stand 34 for holding the chuck table 31 and the moving means 33; a cylindrical rotating support member 35 for supporting the support stand 34 rotatably; and a sliding block 36 for supporting the rotating support member 35. The chuck table 31 will be described by reference to FIG. 5.

Figure 5:
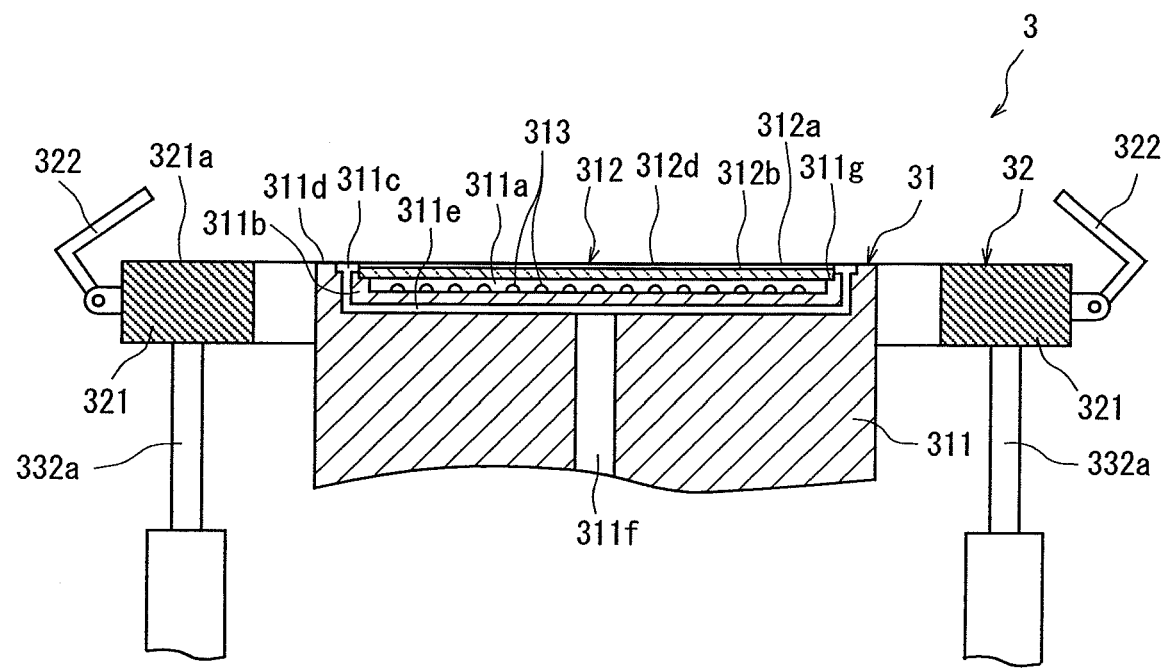
FIG. 5 is a sectional view of a chuck table constituting the tape enlarging mechanism shown in FIG. 4.

The chuck table 31 shown in FIG. 5 comprises a columnar chuck table body 311; a holding member 312 disposed on the upper surface of the chuck table body 311, adapted to hold the wafer sticking region in the dicing tape T mounted on the annular frame F, and comprising a transparent or translucent member; and a light emitting body 313 disposed below the holding member 312 in FIG. 5. The chuck table body 311 comprises a circular fitting concave portion 311a provided in an upper surface thereof, an annular holding member support portion 311b provided to surround the fitting concave portion 311a, an annular suction groove 311c formed to surround the holding member support portion 311b, an annular sealing portion 311d provided to surround the annular suction groove 311c, a communication passage 311e communicating with the annular suction groove 311c, and a suction passage 311f in communication with the communication passage 311e. An annular placing tray 311g, on which the holding member 312 is placed, is provided in an inner peripheral part of the annular holding member support portion 311b. The suction passage 311f is in communication with a suction means (not shown). Thus, when the suction means (not shown) is actuated, a negative pressure is exerted on the annular suction groove 311c via the suction passage 311f and the communication passage 311e. The so configured chuck table body 311 is fixed on an upper surface of the support stand 34 by a suitable fixing means.

The holding member 312 placed on the annular placing tray 311g provided in the annular holding member support portion 311b comprises a 2 to 5 mm thick quartz plate, and an upper surface of the holding member 312 functions as a holding surface 312a for holding the wafer sticking region in the dicing tape T mounted on the annular frame F. A plurality of grooves 312b reaching the outer periphery of the holding surface 312a are formed all over the holding surface 312a. The plurality of grooves 312b have a width set at 0.03 to 0.1 mm, a depth set at 0.05 to 0.1 mm, and a groove interval set at 0.1 to 5 mm. The shape of the groove may be a V-shape or a U-shape.

The light emitting body 313 comprises an LED or the like, and a plurality of the light emitting bodies 313 are arranged on the bottom surface of the circular fitting concave portion 311a and connected to a power circuit (not shown). Thus, the plurality of light emitting bodies 313 are disposed on a side of the holding member 312 opposite to the holding surface 312a, and project light from below the lower surface of the holding member 312.

Returning to FIG. 4 for explanation, the frame holding means 32 constituting the tape enlarging mechanism 3 comprises an annular frame holding member 321 disposed to surround the chuck table 31, and a plurality of clamps 322, as fixing means, disposed on the outer periphery of the annular frame holding member 321. An upper surface of the annular frame holding member 321 forms a placing surface 321a for bearing the annular frame F, and the annular frame to be described later is placed on the placing surface 321a. The annular frame F placed on the placing surface 321a is fixed to the frame holding member 321 by the clamps 322. The thus configured frame holding means 32 is supported to be advanceable and retractable in the up-and-down direction (axial direction) by the moving means 33.

The moving means 33 comprises an annular support member 331 disposed to surround the chuck table 31 and mounted on the upper surface of the support stand 34, and a plurality of air cylinders 332 disposed on the upper surface of the annular support member 331, a piston rod 332a of the air cylinder 332 being coupled to the lower surface of the annular frame holding member 321. The so configured moving means 33 actuates the plurality of air cylinders to move the annular frame holding member 321 in the up-and-down direction (axial direction) among a reference position where the placing surface 321a comes to nearly the same height as the upper surface of the chuck table 31, a first enlarging position lower by a predetermined amount than the upper surface of the chuck table 31, and a second enlarging position lower by a predetermined amount than the first enlarging position.

The support stand 34, which supports the chuck table 31 and the moving means 33, is supported by the upper end of the cylindrical rotating support member 35 to be rotatable within a horizontal plane. That is, a pulse motor (not shown) is disposed within the cylindrical rotating support member 35, and the support stand 34 is rotated in a normal or reverse direction, as appropriate, by actuating this pulse motor. The so configured cylindrical rotating support member 35 is fixed to the upper surface of the sliding block 36 by a suitable fixing means. The sliding block 36 is supported by a support block (to be described later) of the processing feed mechanism 4 to be movable in an indexing feed direction indicated by a double-headed arrow Y in FIG. 3.

By reference to FIG. 3 for explanation, the processing feed mechanism 4 includes a pair of guide rails 41, 41 disposed parallel on the stationary platform 2 along the processing feed direction indicated by the double-headed arrow X. A support block 42 is disposed on the guide rails 41, 41 to be movable in the processing feed direction indicated by the double-headed arrow X. The support block 42 has a pair of guided grooves 421, 421 provided in a lower surface thereof, the guided grooves 421, 421 being fitted to the pair of guide rails 41, 41. The support block 42 also has a pair of guide rails 422, 422 provided on an upper surface thereof, the guide rails 422, 422 being formed parallel along the indexing feed direction indicated by the double-headed arrow Y (i.e., Y-axis direction) which is orthogonal to the processing feed direction indicated by the double-headed arrow X. The to-be-guided grooves 421, 421 are fitted to the pair of guide rails 41, 41, whereby the so configured support block 42 can be moved along the pair of guide rails 41, 41 in the processing feed direction indicated by the double-headed arrow X (X-axis direction). The processing feed mechanism 4 in the illustrated embodiment is equipped with a processing feed means 43 for moving the support block 42 along the pair of guide rails 41, 41 in the processing feed direction indicated by the double-headed arrow X (X-axis direction). The processing feed means 43 includes an externally threaded rod 431 disposed between the pair of guide rails 41 and 41 and parallel thereto, and a drive source, such as a pulse motor 432, for rotationally driving the externally threaded rod 431. The externally threaded rod 431 has one end rotatably supported by a bearing block 433 fixed to the stationary platform 2, and has the other end transmissibly connected to the output shaft of the pulse motor 432. The externally threaded rod 431 is screwed into an internally threaded through hole formed in an internal thread block (not shown) provided protrusively on the lower surface of a central part of the support block 42. Thus, the externally threaded rod 431 is driven in normal rotation and reverse rotation by the pulse motor 432, whereby the support block 42 is moved along the guide rails 41, 41 in the processing feed direction indicated by the double-headed arrow X (X-axis direction).

The processing feed mechanism 4 in the illustrated embodiment has a processing feed position detecting means 44 for detecting the processing feed position of the tape enlarging mechanism 3 disposed on the support block 42. The processing feed position detecting means 44 comprises a linear scale 44a disposed along the guide rail 41, and a read head 44b disposed on the support block 42 and moving together with the support block 42 along the linear scale 44a. The read head 44b of the processing feed position detecting means 44 in the illustrated embodiment transmits a pulse signal involving one pulse per μm to a control means (to be described later). The control means to be described later counts the inputted pulse signals to detect the processing feed position of the tape enlarging mechanism 3 disposed on the support block 42. When the pulse motor 432 is used as the drive source of the processing feed means 43, the processing feed position of the tape enlarging mechanism 3 disposed on the support block 42 can be detected by counting drive pulses of the control means (to be described later) which outputs drive signals to the pulse motor 432. When a servo motor is used as the drive source of the processing feed means 43, pulse signals outputted by a rotary encoder for detecting the number of revolutions of the servo motor are transmitted to the control means to be described later, and the pulse signals received by the control means are counted, whereby the processing feed position of the tape enlarging mechanism 3 disposed on the sliding block 36 can be detected.

The sliding block 36 of the tape enlarging mechanism 3 has a pair of to-be-guided grooves 361, 361 provided in a undersurface thereof, the to-be-guided grooves 361, 361 being fitted to the pair of guide rails 422, 422 provided on the upper surface of the support block 42. The to-be-guided grooves 361, 361 are fitted to the pair of guide rails 422, 422, whereby the sliding block 36 is configured so as to be movable in the indexing feed direction indicated by the double-headed arrow Y (Y-axis direction). The laser processing apparatus 1 in the illustrated embodiment is equipped with a first indexing feed means 45 for moving the sliding block 36 along the pair of guide rails 422, 422, which are provided in the support block 42, in the indexing feed direction indicated by the double-headed arrow Y (Y-axis direction). The first indexing feed means 45 includes an externally threaded rod 451 disposed in parallel between the pair of guide rails 422 and 422, and a drive source, such as a pulse motor 452, for rotationally driving the externally threaded rod 451. The externally threaded rod 451 has one end rotatably supported by a bearing block 453 fixed to the upper surface of the support block 42, and has the other end transmissibly connected to the output shaft of the pulse motor 452. The externally threaded rod 451 is screwed into an internally threaded through hole formed in an internal thread block (not shown) provided protrusively on the undersurface of a central part of the sliding block 36. Thus, the externally threaded rod 451 is driven in normal rotation and reverse rotation by the pulse motor 452, whereby the sliding block 36 is moved along the guide rails 422, 422 in the indexing feed direction indicated by the double-headed arrow Y (Y-axis direction).

The laser processing apparatus 1 in the illustrated embodiment has an indexing feed position detecting means 46 for detecting the indexing feed position of the tape enlarging mechanism 3. The indexing feed position detecting means 46 comprises a linear scale 461 disposed along the guide rail 422, and a read head 462 disposed on the sliding block 36 and moving together with the sliding block 36 along the linear scale 461. The read head 462 of the indexing feed position detecting means 46 in the illustrated embodiment transmits a pulse signal comprising one pulse per μm to the control means (to be described later). The control means to be described later counts the inputted pulse signals to detect the indexing feed position of the tape enlarging mechanism 3. When the pulse motor 452 is used as the drive source of the first indexing feed means 45, the processing feed position of the tape enlarging mechanism 3 can be detected by counting drive pulses of the control means (to be described later) which outputs drive signals to the pulse motor 452. When a servo motor is used as the drive source of the first indexing feed means 45, pulse signals outputted by a rotary encoder for detecting the number of revolutions of the servo motor are transmitted to the control means to be described later, and the pulse signals received by the control means are counted, whereby the indexing feed position of the tape enlarging mechanism 3 can be detected.

Next, the laser beam projection unit support mechanism 6 for supporting the laser beam projection unit 5 will be described.

The laser beam projection unit support mechanism 6 in the illustrated embodiment has a pair of guide rails 61, 61 disposed parallel on the stationary platform 2 along the indexing feed direction indicated by the double-headed arrow Y, and a movable support platform 62 disposed on the guide rails 61, 61 to be movable in the direction indicated by the double-headed arrow Y. The movable support platform 62 comprises a moving support portion 621 movably disposed on the guide rails 61, 61, and a mounting portion 622 mounted on the moving support portion 621.

The mounting portion 622 has a pair of guide rails 623, 623 provided parallel on a side surface thereof, the guide rails 623, 623 extending in a direction indicated by a double-headed arrow Z. The laser beam projection unit support mechanism 6 in the illustrated embodiment is equipped with a second indexing feed means 63 for moving the movable support platform 62 along the pair of guide rails 61, 61 in the indexing feed direction indicated by the double-headed arrow Y. The second indexing feed means 63 includes an externally threaded rod 631 disposed in parallel between the pair of guide rails 61 and 61, and a drive source, such as a pulse motor 632, for rotationally driving the externally threaded rod 631. The externally threaded rod 631 has one end rotatably supported by a bearing block (not shown) fixed to the stationary platform 2, and has the other end transmissibly connected to the output shaft of the pulse motor 632. The externally threaded rod 631 is screwed into an internally threaded hole formed in an internal thread block (not shown) provided protrusively on the undersurface of a central part of the moving support portion 621 constituting the movable support platform 62. Thus, the externally threaded rod 631 is driven in normal rotation and reverse rotation by the pulse motor 632, whereby the movable support platform 62 is moved along the guide rails 61, 61 in the indexing feed direction indicated by the double-headed arrow Y.

Next, the laser beam projection unit 5 supported by the laser beam projection unit support mechanism 6 will be described.

The laser beam projection unit 5 in the illustrated embodiment is equipped with a unit holder 51, and a laser beam projection means 52 attached to the unit holder 51. The unit holder 51 is provided with a pair of to-be-guided grooves 511, 511 slidably fitted to a pair of guide rails 623, 623 provided on the mounting portion 622 of the movable support platform 62. These to-be-guided grooves 511, 511 are fitted to the guide rails 623, 623, whereby the unit holder 51 is supported to be movable in the direction indicated by the double-headed arrow Z.

The laser beam projection means 52 includes a casing 521 mounted on the unit holder 51, a pulsed laser beam oscillation means (not shown) disposed within the casing 521, and an optical focusing instrument 522 disposed at the leading end of the casing 521 and adapted to project a pulsed laser beam, which has been oscillated by the pulsed laser beam oscillation means, onto a workpiece held on the tape enlarging mechanism 3.

An imaging means 7 for detecting a processing region, which is to be laser-processed by the laser beam projection means 52, is disposed at a front end part of the casing 521 constituting the laser beam projection means 52. The imaging means 7 has an illumination means for illuminating the workpiece, an optical system for catching a region illuminated by the illumination means, and an imaging device (CCD) for forming an image from the region caught by the optical system, and sends an image signal on the image to the control means (not shown).

The laser beam projection unit 5 in the illustrated embodiment is equipped with a focused spot position adjusting means 53 for moving the unit holder 51 along the pair of guide rails 623, 623, which are provided on the mounting portion 622 of the movable support platform 62, in the direction indicated by the double-headed arrow Z. The focused spot position adjusting means 53 includes an externally threaded rod (not shown) disposed between the pair of guide rails 623 and 623, and a drive source, such as a pulse motor 532, for rotationally driving the externally threaded rod. The externally threaded rod (not shown) is driven in normal rotation and reverse rotation by the pulse motor 532, whereby the unit holder 51 and the laser beam projection means 52 are moved along the guide rails 623, 623 in the direction indicated by the double-headed arrow Z. In the illustrated embodiment, the pulse motor 532 is driven in normal rotation to move the laser beam projection means 52 upward, while the pulse motor 532 is driven in reverse rotation to move the laser beam projection means 52 downward.

The laser processing apparatus 1 in the illustrated embodiment includes a control means 8. The control means 8 is composed of a computer, and has a central processing unit (CPU) 81 for performing computation according to a control program, a read only memory (ROM) 82 accommodating the control program, etc., a random access memory (RAM) 83 capable of reading and writing which accommodates data on the X,Y coordinate values of a starting point and an end point for projecting a pulsed laser beam to the workpiece (to be described later) and the results of computation and so on, a counter 84, an input interface 85 and an output interface 86. The input interface 85 of the control means 8 receives detection signals from the processing feed position detecting means 44, the indexing feed position detecting means 46, and the imaging means 7. The output interface 86 of the control means 8 outputs control signals to the light emitting bodies 313 provided in the chuck table 31, the air cylinders 332 constituting the moving means 33 of the tape enlarging mechanism 3, the pulse motor 432 of the processing feed means 43, the pulse motor 452 of the first indexing feed means 45, the pulse motor 532 of the focused spot position adjusting means 53, and the pulse motor 632 of the second indexing feed means 63.

The method for breaking an adhesive film mounted on the back of the wafer will be described below, the method being adapted to break the adhesive film 11 for die bonding, which is mounted on the back 10b of the semiconductor wafer 10, along the devices 102 with the use of the above-mentioned laser processing apparatus 1, with the adhesive film 11 being stuck to the surface of the dicing tape T mounted on the annular frame F.

Figure 2:
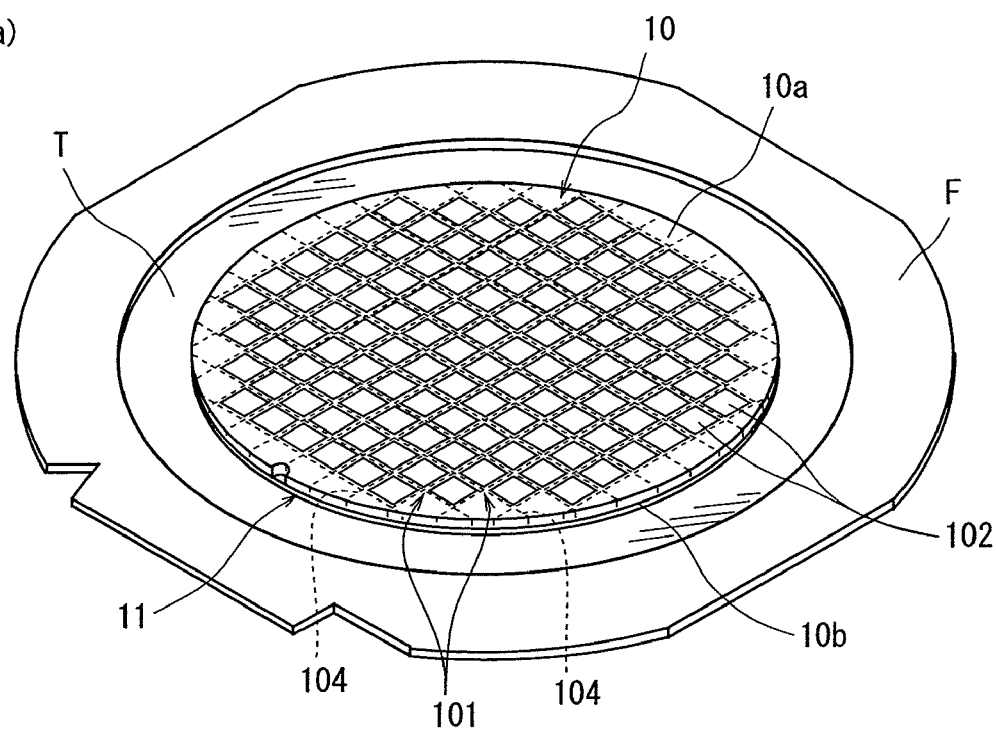
FIGS. 2(a) and 2(b) are a perspective view and a partial sectional view, respectively, of a second embodiment showing a state where a semiconductor wafer having an adhesive film for die bonding mounted on the back thereof is stuck to a dicing tape mounted on an annular frame.
Figure 2:
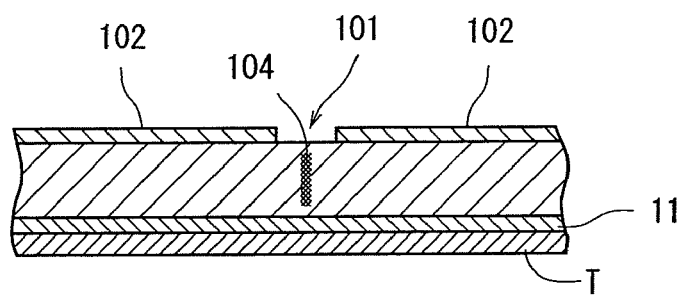
Figure 6:
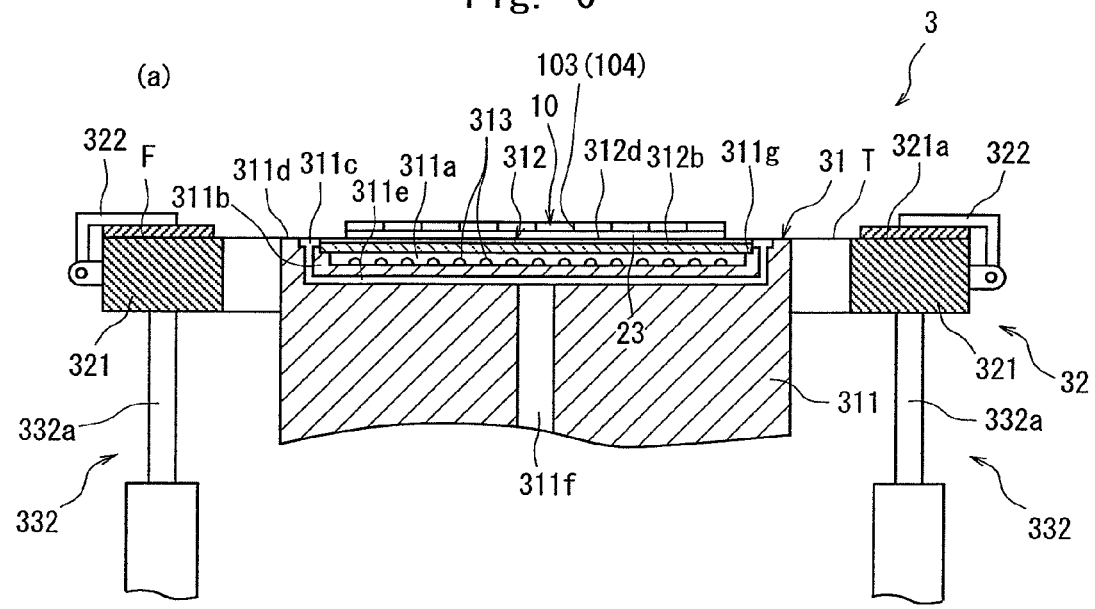
FIGS. 6(a) and 6(b) are explanation drawings of a first tape enlarging step in the method for breaking the adhesive film mounted on the back of the wafer according to the present invention.
Figure 6:
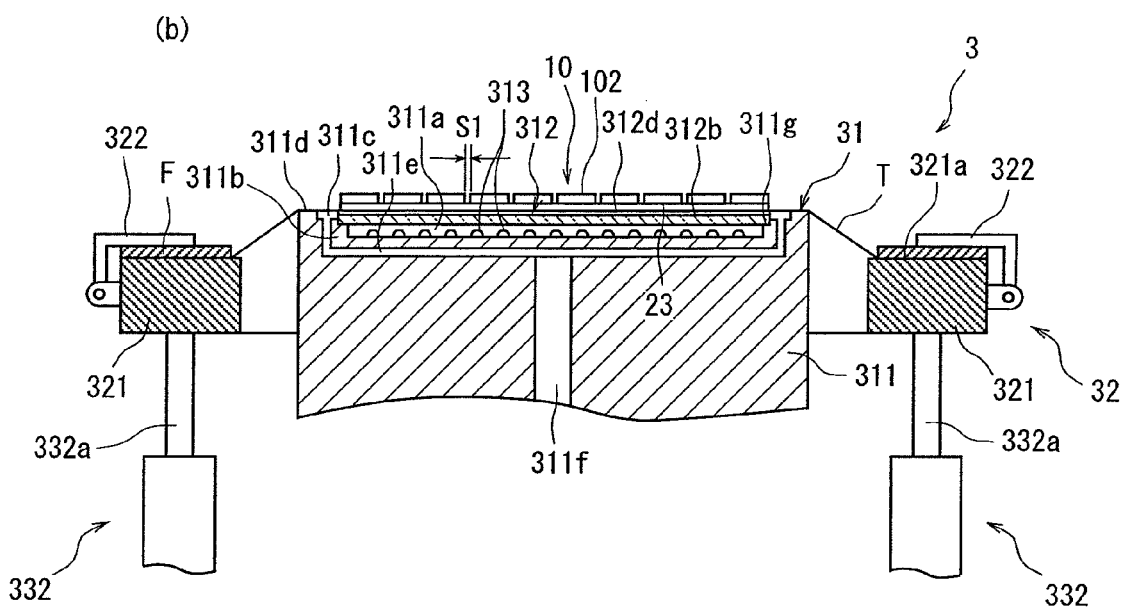

First, the annular frame F supporting the semiconductor wafer 10 (having the division grooves 103 or the deteriorated layers 104 formed along the division-scheduled lines 101) via the dicing tape T is placed on the placing surface 321a of the annular frame holding member 321 constituting the frame holding means 32 of the tape enlarging mechanism 3, and the region in the dicing tape T to which the semiconductor wafer 10 has been stuck (i.e., wafer sticking region) is placed on the holding member 312 of the chuck table 31, as shown in FIG. 6(a). The annular frame F is fixed to the frame holding member 321 by the plurality of clamps 322 (frame fixing step). At this time, the frame holding member 321 is positioned at the reference position shown in FIG. 6(a). Then, the control means 8 actuates the plurality of air cylinders 332 of the moving means 33 constituting the tape enlarging means 3 to lower the annular frame holding member 321 to the first enlarging position shown in FIG. 6(b). Thus, the annular frame F fixed onto the placing surface 321a of the frame holding member 321 also descends, so that the dicing tape T mounted on the annular frame F is enlarged upon contact with the outer peripheral edge of the upper end of the chuck table 31 (first tape enlarging step). As a result, the semiconductor wafer 10 supported via the adhesive film 11 stuck to the dicing tape T undergoes radial tensile force. When the semiconductor wafer 10 supported via the adhesive film 11 stuck to the dicing tape T undergoes radial tensile force, gaps S1 between the devices 102 are widened, if the semiconductor wafer 10 is divided by the division grooves 103, as shown in FIG. 1. Even when the first tape enlarging step is performed, the adhesive film 11 is tenacious and, when subjected to tension, is elongated and is difficult to break. When radial tensile force acts on the semiconductor wafer 10 supported via the adhesive film 11 stuck to the dicing tape T as mentioned above, the semiconductor wafer 10, if having the deteriorated layers 104 formed interiorly along the streets 101 as shown in FIG. 2, is divided into the individual devices 102 along the streets 101 decreased in strength because of the formation of the deteriorated layers 104. However, the adhesive film 11 is tenacious and, when subjected to tension, is elongated and is difficult to break reliably. As seen here, the adhesive film 11 is not broken, but elongated, so that the gaps S1 are formed between the individual devices 102 divided as above.

After the above-described first tape enlarging step is carried out, the suction means (not shown) is actuated, with the dicing tape T being enlarged, to suction-hold the semiconductor wafer 10 onto the holding member 312 of the chuck table 31 via the wafer sticking region in the dicing tape T placed on the chuck table 31 (wafer suction holding step).

Figure 7:
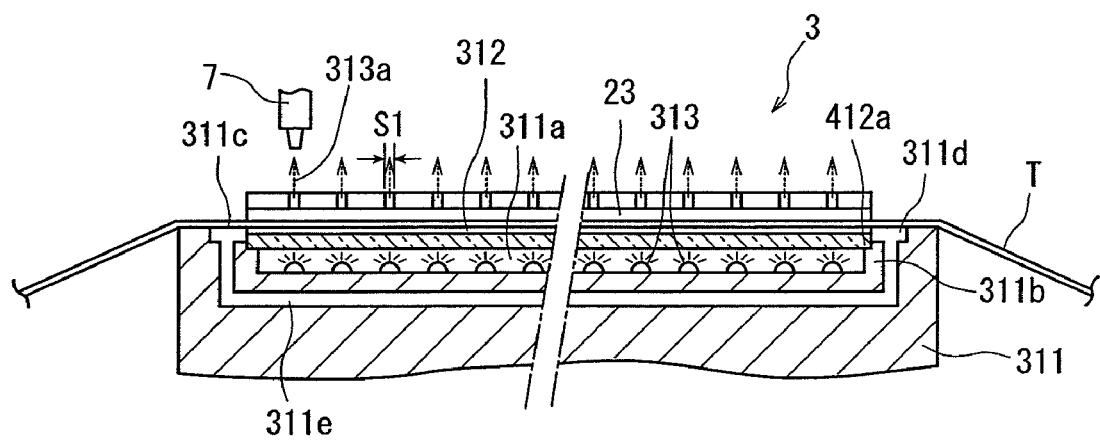
FIG. 7 is an explanation drawing of an alignment step in the method for breaking the adhesive film mounted on the back of the wafer according to the present invention.

Then, with the dicing tape T being enlarged upon execution of the above first tape enlarging step and wafer holding step, an alignment step is performed for detecting the processing region, where laser processing is to be carried out, of the adhesive film 11 mounted on the back 10b of the semiconductor wafer 10 divided into the individual devices 102. That is, the control means 8 actuates the processing feed means 43 to position the tape enlarging mechanism 3 directly below the imaging means 7. Once the tape enlarging mechanism 3 is positioned directly below the imaging means 7, the control means 8 lights the light emitting bodies 313 disposed below the holding member 312 which comprises a transparent or translucent member and constitutes the chuck table 31, as shown in FIG. 7. Then, the alignment step is carried out for performing image processing, such as pattern matching, for aligning the optical focusing instrument 522 with the gap S1 between the devices 102 divided along the division-scheduled line 101 formed in the predetermined direction of the semiconductor wafer 10, to detect the processing region to be subjected to laser processing. The alignment step for detecting the processing region to be similarly laser processed is also carried out for the gap S1 between the devices 102 divided along the street 101 extending perpendicularly to the above predetermined direction in the semiconductor wafer 10.

In performing the above-described alignment step, the light emitting bodies 313 disposed below the holding member 312 comprising a transparent or translucent member and constituting the chuck table 31 are lit. Thus, light projected from the light emitting bodies 313 passes through the translucent dicing tape T and the holding member 312 comprising the transparent or translucent member, and transmits through the gaps S1 between the devices 102 divided along the streets 101 formed in the semiconductor wafer 10, as indicated by arrows 313a in FIG. 7. Thus, the imaging means 7 can reliably recognize the region where light has transmitted through the gap S1 between the devices 102 divided along the street 101 formed in the semiconductor wafer 10.

After the alignment step of detecting the processing region, to be laser-processed, of the adhesive film 11 mounted on the back 10b of the semiconductor wafer 10 has been performed in the above manner, the control means 8 stores the X, Y coordinate values of the processing region, which is to be laser-processed, into the random access memory (RAM) 83. The X, Y coordinate values of the processing region to be laser-processed can be gained from the detection signals transmitted from the processing feed position detecting means 42 and the indexing feed position detecting means 46.

Figure 8:
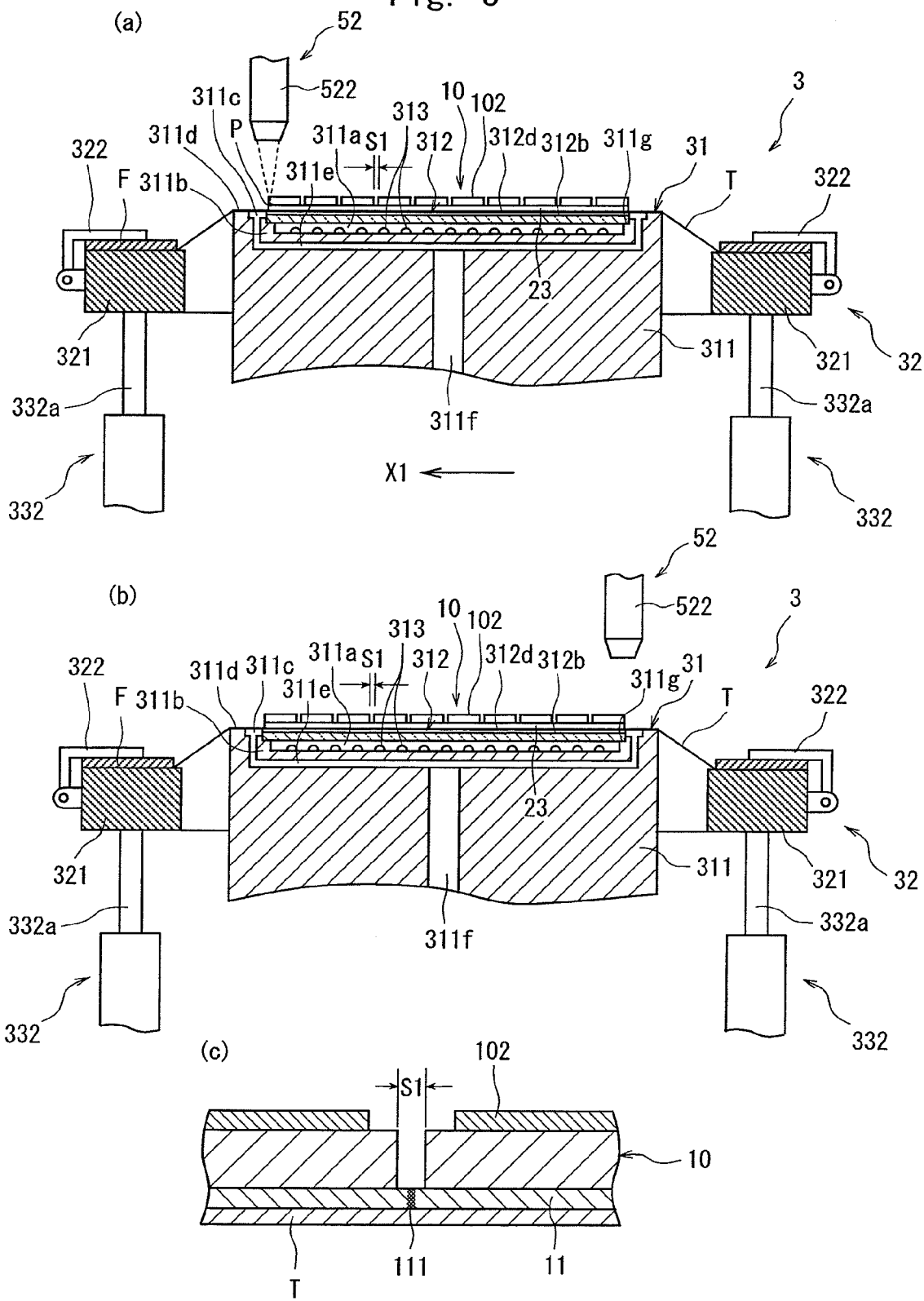
FIGS. 8(a), 8(b) and 8(c) are explanation drawings of an deteriorated layer forming step in the method for breaking the adhesive film mounted on the back of the wafer according to the present invention.

Then, as shown in FIGS. 8(a) to 8(c), the semiconductor wafer 10, which has been stuck to the dicing tape T held on the frame holding means 32 of the tape enlarging mechanism 3 via the annular frame F and has been suction-held on the holding member 312 of the chuck table 31, is moved to the laser beam projecting region where the optical focusing instrument 522 is positioned, whereby the gap S1 between the devices 102 divided along the predetermined streets 101 is positioned directly below the optical focusing instrument 522. At this time, the semiconductor wafer 10 is positioned such that one end (left end in FIG. 8(a)) of the gap S1 formed along the division-scheduled line 101 is positioned directly below the optical focusing instrument 522. Then, the control means 8 outputs a control signal to the pulsed laser beam projection means 52 to project a pulsed laser beam with a pulse width of 100 picoseconds (ps) or less from the optical focusing instrument 522 and, during this process, controls the processing feed means 43 to move the tape enlarging mechanism 3 at a predetermined processing feed speed in a direction indicated by an arrow X1 in FIG. 8(a). When the other end of the gap S1 formed along the street 101 arrives at the position directly below the optical focusing instrument 522 as shown in FIG. 8(b), projection of the pulsed laser beam is terminated, and the movement of the tape enlarging mechanism 3 is stopped.

As a result, the deteriorated layer 111 is formed in the adhesive film 11 along the gap S1 between the devices 102 as shown in FIG. 8(c) (deteriorated layer forming step). In this deteriorated layer forming step, the deteriorated layer 111 can be reliably formed in the adhesive film 11 along the outer peripheral edge of the device 102, since the gap S1 between the devices 102 has been recognized without fail, and the region to be laser-processed has been clearly detected, in the aforementioned alignment step.

EXPERIMENTAL EXAMPLE

An explanation will be offered for an experimental example on the pulse width of the pulsed laser beam projected onto the adhesive film 11 in the deteriorated layer forming step, and the incidence of debris.

Processing conditions in the deteriorated layer forming step:

Light source: LD-excited Q-switched Nd:YVO4 pulsed laser

Wavelength: Pulsed laser at 355 nm

Pulse width: 200 ns, 100 ns, 10 ns, 100 ps, 50 ps, 10 ps

Repetition frequency: 100 kHz

Average output: 1 W, 2 W, 3 W

Diameter of focused spot: 10 μm

Processing feed speed: 600 mm/second

The results of projection of the pulsed laser beam onto the adhesive film 11 under the above-mentioned processing conditions are shown in FIG. 10.

As shown in FIG. 10, when the average output of the pulsed laser beam was set at 1 W, debris is deposited on the surface of the device 102 in all of the pulse widths of 200 nanoseconds (ns), 100 nanoseconds (ns) and 10 nanoseconds (ns). When the average output of the pulsed laser beam was set at 1 W, no debris is deposited on the surface of the device 102 in the pulse widths of 100 picoseconds (ps), 50 picoseconds (ps) and 10 picoseconds (ps).

When the average output of the pulsed laser beam was set at 2 W, debris is deposited on the surface of the device 102 in all of the pulse widths of 200 nanoseconds (ns), 100 nanoseconds (ns) and 10 nanoseconds (ns). When the average output of the pulsed laser beam was set at 2 W, debris is slightly deposited on the surface of the device 102 in the pulse width of 100 picoseconds (ps), although the debris did not greatly affect the quality of the device 102. When the average output of the pulsed laser beam was set at 2 W, no debris is deposited on the surface of the device 102 in the pulse widths of 50 picoseconds (ps) and 10 picoseconds (ps).

When the average output of the pulsed laser beam was set at 3 W, debris is deposited on the surface of the device 102 in all of the pulse widths of 200 nanoseconds (ns), 100 nanoseconds (ns) and 10 nanoseconds (ns). When the average output of the pulsed laser beam was set at 3 W, debris is slightly deposited on the surface of the device 102 in the pulse width of 100 picoseconds (ps), although the debris did not greatly affect the quality of the device 102, as when the average output was 2 W. When the average output of the pulsed laser beam was set at 3 W, no debris is deposited on the surface of the device 102 in the pulse widths of 50 picoseconds (ps) and 10 picoseconds (ps).

In the light of the above-mentioned experimental results, the pulse width of the pulsed laser beam projected onto the adhesive film 11 is desirably 100 picoseconds (ps) or less, and the pulse width of 50 picoseconds (ps) or less is more preferred. Moreover, the average output of the pulsed laser beam projected onto the adhesive film 11 is desirably 1 to 3 W in forming the deteriorated layer in the adhesive film 11, without melt-cutting the adhesive film 11.

As described above, the deteriorated layer forming step is carried out by projecting the pulsed laser beam onto the adhesive film 11 through the gap S1 between the devices 102 divided along the predetermined division-scheduled line 101 to form the deteriorated layer 111 in the adhesive film 11 along the gap S1 between the devices 102. Then, the control means 8 actuates the first indexing feed means 45 to index-feed the tape enlarging mechanism 3 by the spacing between the gaps S1 in the direction indicated by the double-headed arrow Y in FIG. 3 and perform the above-described deteriorated layer forming step. After such execution of the deteriorated layer forming step of projecting the pulsed laser beam onto the adhesive film 11 through the gap S1 between the devices 102 formed in the predetermined direction, the tape enlarging mechanism 3 is turned 90 degrees, followed by performing the deteriorated layer forming step of projecting the pulsed laser beam onto the adhesive film 11 through the gap S1 between the devices 102 formed in a direction perpendicular to the above predetermined direction. As a result, the deteriorated layers 111 are formed in the adhesive film 11 along all the gaps S1 between the devices 102.

Figure 9:
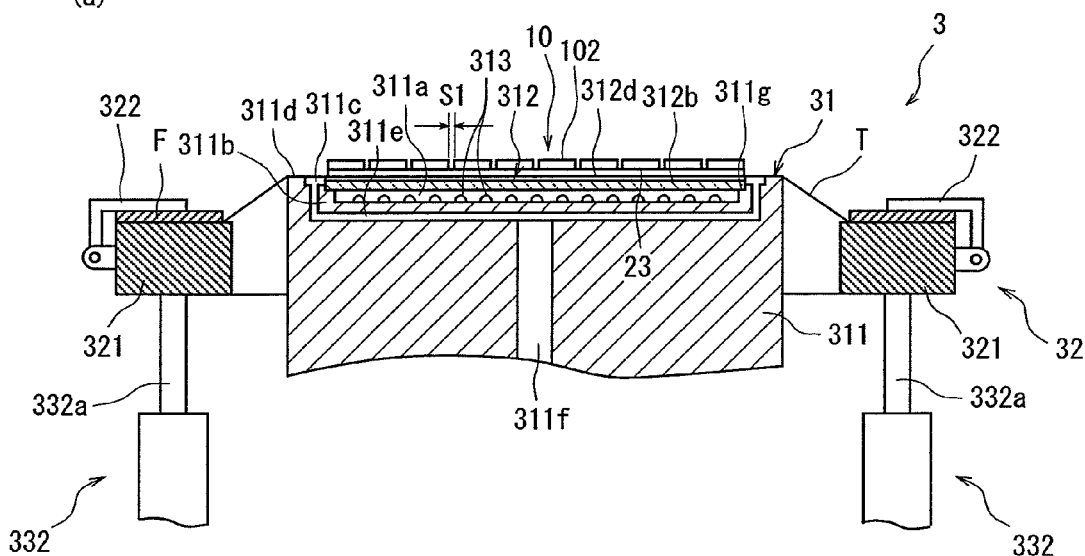
FIGS. 9(a), 9(b) and 9(c) are explanation drawings of an adhesive film breaking step in the method for breaking the adhesive film mounted on the back of the wafer according to the present invention.
Figure 9:
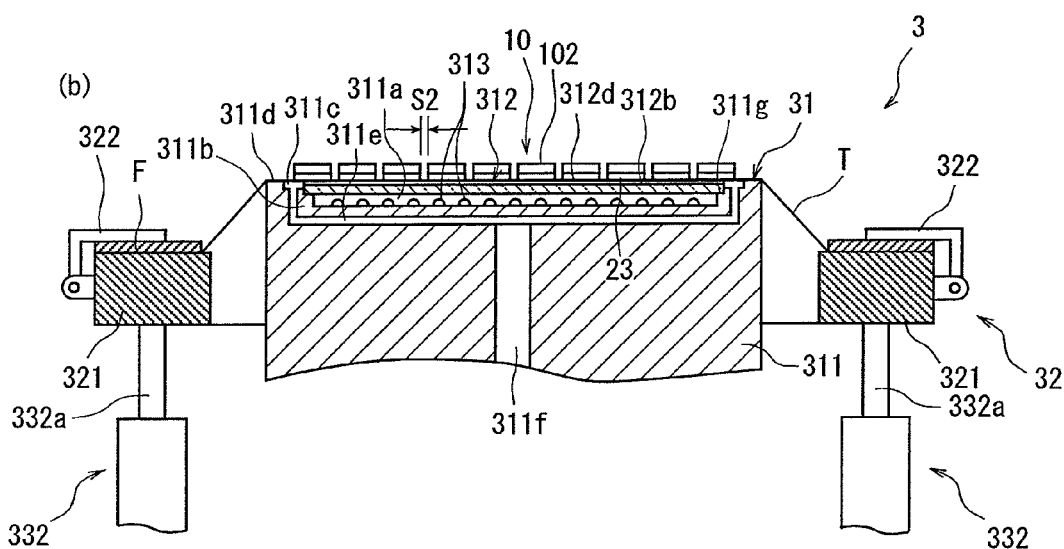
Figure 9:
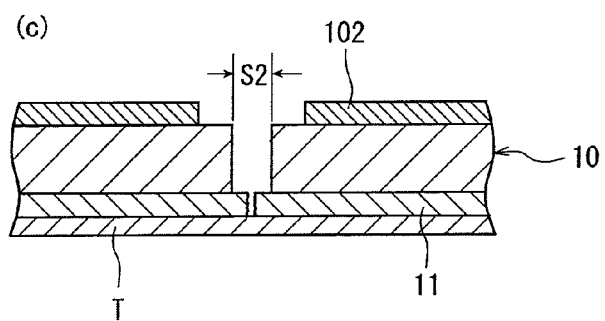

After the deteriorated layer forming step has been carried out in the above-mentioned manner, there is performed an adhesive film breaking step of exerting external force on the adhesive film 11 having the deteriorated layers 111 formed along the outer peripheral edges of the individual devices 102 to break the adhesive film 11 along the deteriorated layers 111. This adhesive film breaking step is carried out by performing a second tape enlarging step of further enlarging the dicing tape T from the aforementioned state, in which the dicing tape T has been subjected to the first tape enlarging step, whereby the adhesive film 11 having the deteriorated layers 111 formed along the outer peripheral edges of the individual devices 102 is broken along the outer peripheral edges of the individual devices 102. In this second tape enlarging step, the suction and holding of the semiconductor wafer 10 sucked onto and held on the holding member 312 of the chuck table 31 via the dicing tape T are released after the execution of the deteriorated layer forming step shown in FIG. 9(a). Then, the plurality of air cylinders 332 of the moving means 33 constituting the tape enlarging means 3 are actuated to lower the annular frame holding member 321 to a second enlarging position shown in FIG. 9(b). Thus, the annular frame F fixed onto the placing surface 321a of the frame holding member 321 also descends. Thus, as shown in FIG. 9(b), the dicing tape T mounted on the annular frame F is further enlarged upon contact with the outer peripheral edge of the upper end of the chuck table 31 (second tape enlarging step). As a result, further tension acts on the adhesive film 11 stuck to the dicing tape T. Thus, as shown in FIG. 9(c), the space between the individual devices 102 is widened to a gap S2, whereby the adhesive film 11 is broken along the deteriorated layers 111 formed along the outer peripheral edges of the individual devices 102. As noted here, in performing the second tape enlarging step, the adhesive film 11 has the deteriorated layers 111 formed along the outer peripheral edges of the individual devices 102. Thus, the adhesive film 11 is broken easily and reliably along the deteriorated layers 111.

While the preferred embodiments of the present invention have been described in detail by reference to the accompanying drawings, it is to be understood that the invention is not limited to such embodiments, but various changes and modifications may be made without departing from the scope of the present invention.

What is claimed is:

1. A method for breaking an adhesive film mounted on a back of a wafer having a plurality of streets formed in a lattice pattern on a face of the wafer, and having devices formed in a plurality of regions demarcated by the plurality of streets, the devices being divided individually, the method being adapted to break the adhesive film along outer peripheral edges of the individual devices, with the adhesive film being stuck to a surface of a dicing tape mounted on an annular frame, the method comprising:

a laser processing step of projecting a laser beam with a pulse width of 100 picoseconds or less onto the adhesive film through gaps between the individually divided devices to form deteriorated layers in the adhesive film along the outer peripheral edges of the individual devices; and an adhesive film breaking step of exerting external force on the adhesive film having the deteriorated layers formed therein, to break the adhesive film along the deteriorated layers.

2. The method for breaking an adhesive film mounted on a back of a wafer according to claim 1, wherein the pulse width of the laser beam projected onto the adhesive film in the laser processing step is set at 50 picoseconds or less.

3. The method for breaking an adhesive film mounted on a back of a wafer according to claim 1, wherein an average output of the laser beam projected onto the adhesive film in the laser processing step is set at 1 to 3 W.

4. The method for breaking an adhesive film mounted on a back of a wafer according to claim 1, wherein the laser processing step is performed, with the dicing tape being enlarged to widen the gaps between the individual devices.

5. The method for breaking an adhesive film mounted on a back of a wafer according to claim 1, wherein the adhesive film breaking step enlarges the dicing tape to apply tension to the adhesive film.

* * * * *